(12) United States Patent
Simpson

(10) Patent No.: US 11,574,894 B2
(45) Date of Patent: Feb. 7, 2023

(54) SEMICONDUCTOR DEVICE SUB-ASSEMBLY

(71) Applicants: Dynex Semiconductor Limited, Lincolnshire (GB); Zhuzhou CRRC Times Electric Co. Ltd., Hunan (CN)

(72) Inventor: Robin Adam Simpson, Lincolnshire (GB)

(73) Assignees: DYNEX SEMICONDUCTOR LIMITED, Lincolnshire (GB); ZHUZHOU CRRC TIMES ELECTRIC CO. LTD, Hunan (CN)

( * ) Notice: Subject to any disclaimer, the term of this patent is extended or adjusted under 35 U.S.C. 154(b) by 90 days.

(21) Appl. No.: 17/258,577

(22) PCT Filed: Jul. 11, 2018

(86) PCT No.: PCT/GB2018/051976
§ 371 (c)(1),
(2) Date: Jan. 7, 2021

(87) PCT Pub. No.: WO2020/012143
PCT Pub. Date: Jan. 16, 2020

(65) Prior Publication Data
US 2021/0167042 A1  Jun. 3, 2021

(51) Int. Cl.
*H01L 25/07* (2006.01)
*H01L 23/00* (2006.01)
(Continued)

(52) U.S. Cl.
CPC ........... *H01L 25/072* (2013.01); *H01L 24/72* (2013.01); *H01L 24/90* (2013.01); *H01L 25/18* (2013.01);
(Continued)

(58) Field of Classification Search
CPC ....... H01L 25/072; H01L 24/72; H01L 24/90; H01L 25/18; H01L 25/50
See application file for complete search history.

(56) References Cited

U.S. PATENT DOCUMENTS 5,866,944 A    2/1999  Hiyoshi
9,574,760 B1 * 2/2017  Olsson ............... H05B 45/3725
(Continued)

FOREIGN PATENT DOCUMENTS

DE   102004018476 A1  11/2005
EP      0064383 A2    11/1982
WO    2017220955 A1   12/2017

OTHER PUBLICATIONS

International Search Report dated Apr. 8, 2019 for corresponding International Patent Application No. PCT/GB2018/051976.

*Primary Examiner* — Thao P Le
(74) *Attorney, Agent, or Firm* — Tarolli, Sundheim, Covell & Tummino LLP

(57) ABSTRACT

We disclose herein a semiconductor device sub-assembly comprising a plurality of semiconductor units of a first type, a plurality of semiconductor units of a second type; a plurality of conductive blocks operatively coupled with the plurality of semiconductor units, a conductive malleable layer operatively coupled with the plurality of conductive blocks, wherein the plurality of conductive blocks are located between the conductive malleable layer and the plurality of semiconductor units. In use, at least some of the plurality of conductive blocks are configured to apply a pressure on the conductive malleable layer, when a predetermined pressure is applied to the semiconductor device sub-assembly. At least one semiconductor unit of a second type is configured to withstand an applied pressure greater than a threshold pressure.

20 Claims, 6 Drawing Sheets

(51) Int. Cl.
    *H01L 25/18*    (2006.01)
    *H01L 25/00*    (2006.01)

(52) U.S. Cl.
    CPC ...... *H01L 25/50* (2013.01); *H01L 2924/1203* (2013.01); *H01L 2924/13055* (2013.01)

(56) References Cited

U.S. PATENT DOCUMENTS

| | | | |
|---|---|---|---|
| 2002/0004293 A1* | 1/2002 | Soininen | H01L 21/76883 |
| | | | 438/650 |
| 2002/0145188 A1 | 10/2002 | Kodama | |
| 2009/0086527 A1* | 4/2009 | Lee | H01L 27/101 |
| | | | 365/100 |
| 2019/0067248 A1* | 2/2019 | Yoo | H01L 24/13 |
| 2019/0206776 A1* | 7/2019 | Simpson | H01L 24/97 |
| 2020/0168959 A1* | 5/2020 | Hettrich | H01M 10/63 |
| 2020/0365953 A1* | 11/2020 | Pham | H01M 50/116 |
| 2021/0400838 A1* | 12/2021 | Nottelmann | H01L 23/4006 |
| 2022/0246598 A1* | 8/2022 | Chen | H01L 24/94 |
| 2022/0246681 A1* | 8/2022 | Parekh | H01L 27/11582 |
| 2022/0285233 A1* | 9/2022 | Li | H01L 25/0657 |
| 2022/0293560 A1* | 9/2022 | Chen | H01L 25/50 |

* cited by examiner

STATE OF THE ART

STATE OF THE ART

STATE OF THE ART

STATE OF THE ART

STATE OF THE ART

STATE OF THE ART

US 11,574,894 B2

SEMICONDUCTOR DEVICE SUB-ASSEMBLY

RELATED APPLICATIONS

The present application is a U.S. National Stage application under 35 USC 371 of PCT Application Serial No. PCT/GB2018/051976, filed on 11 Jul. 2018; the entirety of which is incorporated herein by reference.

TECHNICAL FIELD

The present disclosure relates to a semiconductor device sub-assembly.

BACKGROUND

Individual semiconductor chips can be connected in parallel within a single pressure contact housing to provide a single device containing multiple chips with a current handling capability that is ideally the sum of the capability of all the chips contained within the housing.

For optimum performance of the multiple chip device, the following requirements must be met:
The pressure distribution across each chip and between chips should be uniform.
The applied pressure should be within a defined operating range.

Figure 1:
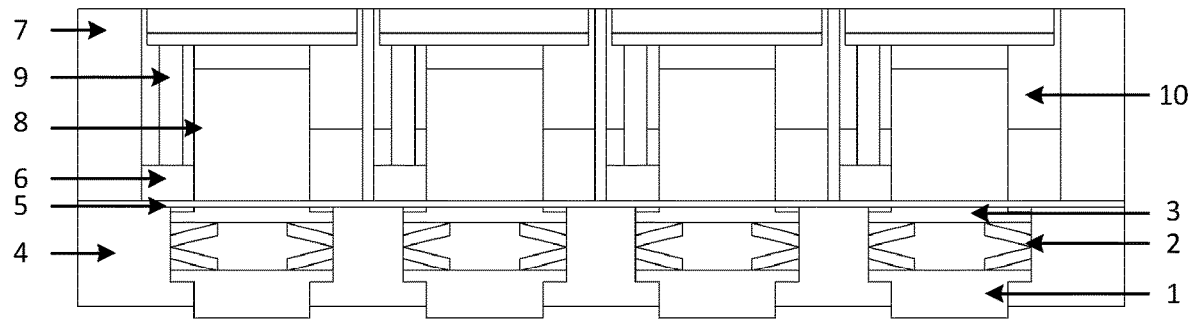

WO/2017/220955 demonstrates a multiple-chip semiconductor device sub-assembly that incorporates stacks of disc springs in line with each semiconductor unit, uses an internal support frame to limit the displacement of the disc springs and provides current bypass of the disc springs using a disc with multiple through holes and a flat, malleable, conductive diaphragm. This is shown in FIG. 1.

During operation, power dissipated in the semiconductor chips causes them to heat up. The chips have a defined maximum temperature for safe operation. In typical applications, therefore, the chips must be cooled to ensure they are kept within the safe temperature range. Heat is extracted from the chips by conduction through the main electrode. The heat may be transferred to a liquid coolant using liquid-cooled heatsinks or the air using air-cooled heatsinks.

Figure 2:
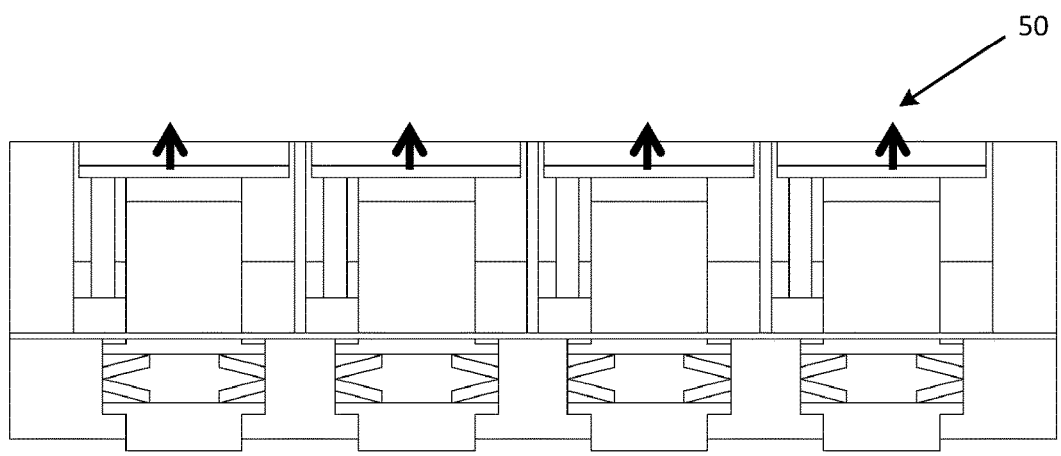

As per the devices that are shown in WO/2017/220955, significant heat transfer can only be achieved through one electrode—the electrode in direct pressure contact with the semiconductor units. This heat transfer 50 is shown in FIG. 2. The use of the stacks of disc springs, which are vital for ensuring pressure uniformity, could reduce the efficiency of heat transfer between the chip and main electrode on the sprung side of the device to the point that heat transfer in this direction is considered to be negligible. WO/2017/220955 also demonstrates alternative devices, whereby the disc springs are omitted and instead the diaphragm is designed to act as the spring mechanism.

The efficiency of the heat transfer from the chips to the device's main electrodes determines the amount of power that can be dissipated in the chips. The presence of the disc spring stacks or sprung diaphragm means that heat could only be extracted through the unsprung side 50 of the device.

Figure 3:
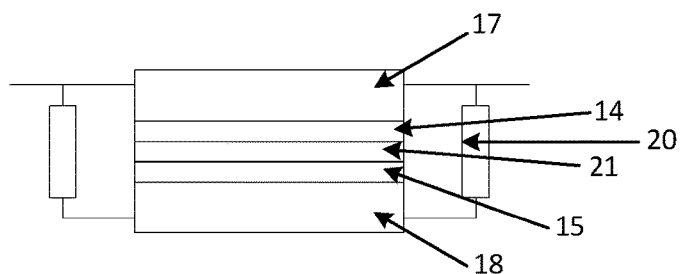

Typical high power single-chip pressure contact semiconductor devices like Thyristors, do not use disc spring stacks, but instead use solid electrodes 17, 18 on both sides of the device (as shown in FIG. 3). This allows for heat transfer from the chip to both main electrodes.

Figure 4:
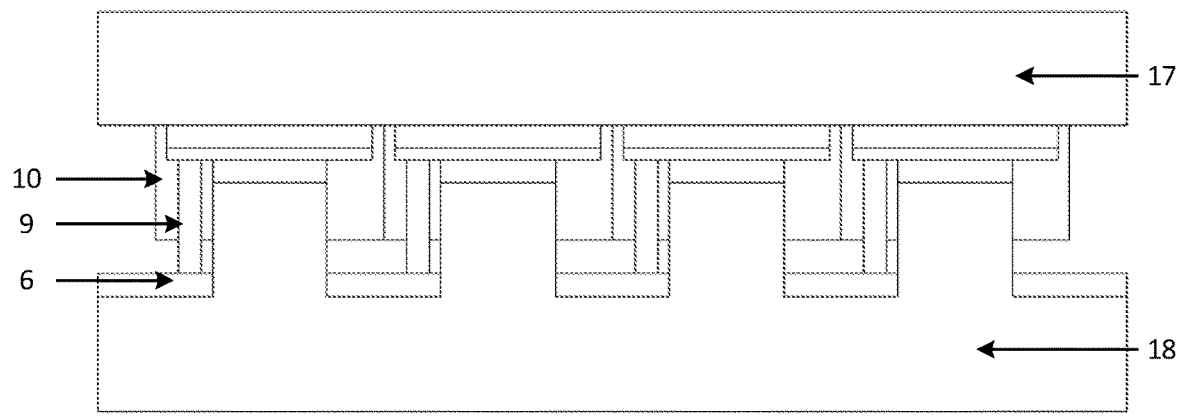

Traditional multi-chip pressure contact semiconductor devices adopt a similar approach to permit heat transfer to both main electrodes, as shown in FIG. 4. However, devices manufactured in this way suffer from a serious design flaw. When such a device is operated, heat is generated by the chips within the device whilst the outer surfaces of the device are cooled. This means that the internal surfaces of a device's main electrodes are hotter than their external surfaces. This temperature mismatch leads to differential thermal expansion through the electrodes. As the internal surfaces are hotter, they expand to a greater extent than the external surfaces, which leads to bending of the electrodes.

A small amount of distortion can be tolerated, as the main electrode material has some elasticity, which means that pressure contact is maintained for very low levels of distortion. However distortion of the main electrodes can lead to total loss of pressure contact with the some chips, meaning the cooling of affected chips is severely impaired. The level of distortion increases significantly as electrode area is increased. This means that this approach is only suitable for devices with a small overall contact area containing small numbers of chips. When large-area devices containing large numbers of chips are designed in this manner the bending of the electrodes is so great that the performance of such devices is significantly impaired.

Tinschert et al, "*Possible failure modes in Press-Pack IGBTs*" 2015, investigates the poor reliability of traditional design press-pack IGBT devices. The authors conclude that the premature failures are the result of a mixture of over-pressurisation and under-pressurisation of certain chips in a device, resulting from thermo-mechanical distortion of the device's main electrodes. This paper shows that with a $\Delta T_j$ of 78° C. the cycles to failure is approximately 6,000 cycles for an IXYS multi-chip pressure contact device of traditional construction. This compares unfavourably with single-chip pressure contact devices, for which at a $\Delta T_j$ of 80° C. the cycles to failure is far in excess of 100,000 cycles.

Frank, Øyvind Bjerke, "*Power Cycle Testing of Press-Pack IGBT Chips*", 2014 follows up work from the study by Tinschert et al (2015). Individual press-pack IGBT chips are subjected to power cycling. The author found that individual chips have a lifetime that is orders of magnitude greater than fully-assembled devices, indicating that the traditional multi-chip pressure contact device design significantly limits their life expectancy.

SUMMARY OF THE DISCLOSURE

According to one aspect of the present disclosure, there is provided a semiconductor device sub-assembly comprising a plurality of semiconductor units of a first type; a plurality of semiconductor units of a second type; a plurality of conductive blocks operatively coupled with the plurality of semiconductor units; a conductive malleable layer operatively coupled with the plurality of conductive blocks, wherein the plurality of conductive blocks are located between the conductive malleable layer and the plurality of semiconductor units. In use, at least some of the plurality of conductive blocks are configured to apply a pressure on the conductive malleable layer, when a predetermined pressure is applied to the semiconductor device sub-assembly; and at least one semiconductor unit of a second type is configured to withstand an applied pressure greater than a threshold pressure.

It will be understood that the predetermined pressure (or the total device load) is applied to the entire device assembly including the semiconductor units of the first and second types. The threshold pressure is a part of the predetermined pressure and the threshold pressure is applied in relation to the semiconductor unit of the first type. All the pressure or load in excess of the threshold load is supported by the semiconductor unit of the second type. The pressure in excess of the threshold load is the withstanding applied pressure to the semiconductor unit of the second type.

The plurality of semiconductor units of a second type may be located laterally in between the plurality of semiconductor units of a first type. At least one semiconductor unit of a second type may be configured to limit displacement of the plurality of semiconductor units of a first type. At least one semiconductor unit of a second type may have a substantially larger area compared to each semiconductor unit of a first type. The sub-assembly may be configured such that, after the pressure is applied, a thermal conductive path is established in opposing directions through at least one semiconductor unit of a second type. At least one semiconductor unit of a first type may be an insulated gate bipolar transistor (IGBT) unit. At least one semiconductor unit of a second type may be a diode unit.

The inventor has appreciated that the efficiency of the heat transfer from the chips to the device's main electrodes determines the amount of power that can be dissipated in the chips. If the thermal resistance is reduced, greater power can be dissipated in the chips. If a method of heat transfer to the main electrode on the sprung side of the device can also be realised, then thermal resistance can be reduced and the allowable power dissipation can be increased.

In state-of-the art devices, multiple small-area diodes were used to make up the diode element of the device. In the present disclosure, the diode element may be provided by a single large-area diode chip. The single large area diode chip facilitates cooling of the entire device. The diode chip allows heat to dissipate from both the top and bottom of the device (or the opposing directions of the device). It will be appreciated that the large area diode chip is a single diode chip and the total area of the single diode chip is about 25% to 50% of the overall area of the semiconductor device sub-assembly.

Stacks of disc springs may be incorporated in line with each of the IGBT chips, but in contrast with the prior-art devices, no disc springs are used in line with the diode chip. Instead, the spring locator may be solid in this region. In such a case, a substantially uniform pressure distribution is achieved by flexing a malleable layer to a predetermined level.

The semiconductor device sub-assembly may further comprise:
 a first electrode directly operatively connected to the plurality of semiconductor units; and
 a second electrode operatively connected to the conductive malleable layer.

The first electrode may be located on a top surface of the sub-assembly and the second electrode may be located on a bottom surface of the sub-assembly.

At least some of the conductive blocks may be configured to flex the conductive malleable layer. The flexing of the conducting malleable layer takes place by applying the threshold load for the area associated with the semiconductor units of the first type (e.g. a power device such as an IGBT). The malleable layer located near the semiconductor unit of the second type (e.g. the diode) does not flex as much as the area of the malleable layer where the semiconductor units of the first type are located.

The semiconductor device sub-assembly may further comprise a stand-off plate operatively connected with an opposing surface of the conductive malleable layer compared to a surface of the conductive malleable layer to which the conductive block is coupled. The conductive malleable layer and conductive blocks may be formed using one piece of material. The stand-off plate and conductive malleable layer may be formed using one piece of material. The stand-off plate, conductive malleable layer and conductive blocks may be formed using one piece of material.

The semiconductor device sub-assembly may further comprise a semiconductor unit locator comprising a plurality of holes wherein at least some of the plurality of semiconductor units may be located in at least some of the holes of the semiconductor unit locator.

The semiconductor device sub-assembly may further comprise a plurality of pressure means for applying pressure to the plurality of the semiconductor units, wherein the conductive malleable layer is located between the plurality of pressure means and the semiconductor unit locator.

The pressure means may comprise a spring.

At least one of the plurality of semiconductor units of a first type may be located vertically above a pressure means.

At least one of the plurality of semiconductor units of a second type may not be located above a pressure means.

Each of the plurality of pressure means may be located underneath a semiconductor unit of a first type.

The semiconductor device sub-assembly may further comprise a spring locator comprising a plurality of holes, wherein each pressure means may be located in each hole of the spring locator.

The spring locator may be solid in the region under the semiconductor units of a second type.

The spring locator may comprise:
 a first portion wherein the first portion is operatively connected to the plurality of semiconductor units of a first type; and
 a second portion wherein the second portion is operatively connected to the plurality of semiconductor units of a second type.

The first portion and the second portion may be separate blocks.

The first portion and the second portion may comprise different materials.

The second portion may form part of a second electrode operatively connected to the conductive malleable layer.

The spring locator may be operatively connected with the conductive malleable layer.

The semiconductor device sub-assembly may further comprise a first thrust pad and a second thrust pad within the holes of the spring locator on both sides of the pressure means, wherein the first thrust pad is protruded from a first surface of the spring locator and the second thrust pad is in contact with the conductive malleable layer.

The first and second thrust pad and the pressure means may be integrated into a discrete component.

The pressure means may be selected such that a predetermined pressure is exerted using the spring locator, the pressure means, the first thrust pad, and the second thrust pad.

The second thrust pad may form part of a second electrode operatively connected to the conductive malleable layer.

The predetermined pressure may be applied to a threshold pressure limit so that the applied pressure compresses each pressure means to a degree that a lower most surface of the first thrust pad is in line with a lower most surface of the spring locator.

The applied pressure above the threshold pressure limit may be supported by the spring locator, conductive malleable layer, and the plurality of semiconductor units of a second type.

At least some of the plurality of semiconductor units of a first type may comprise:
an IGBT chip;
a protection layer at the edge of the semiconductor chip;
a front side strain buffer;
a back side strain buffer;
a control terminal connection spring pin.

At least some of the plurality of semiconductor units of a second type may comprise:
a diode chip;
a protection layer at the edge of the semiconductor chip;
a front side strain buffer;
a back side strain buffer.

According to a further aspect of the present disclosure, there is provided a method for manufacturing a semiconductor device sub-assembly, the method comprising:
providing a plurality of semiconductor units of a first type;
providing a plurality of semiconductor units of a second type;
providing a plurality of conductive blocks operatively coupled with the plurality of semiconductor units;
providing a conductive malleable layer operatively coupled with the plurality of conductive blocks, wherein the plurality of conductive blocks are located between the conductive malleable layer and the plurality of semiconductor units, wherein at least some of the plurality of conductive blocks are used to apply a pressure on the conductive malleable layer, when a predetermined pressure is applied to the semiconductor device sub-assembly; and
wherein at least one semiconductor unit of a second type withstands an applied pressure greater than a threshold pressure.

In summary, a multiple-chip pressure contact semiconductor device containing both IGBT (or any other power device) and diode elements (or a similar purpose device) significantly improves the cooling efficiency for the diode element of the device. The benefit of this improvement in cooling efficiency will allow the area that the diode element occupies within the device to be reduced, freeing up more area for IGBT chips. As device current rating is proportional to total area of the IGBT elements, an increase in device current rating will be realised.

The diode element acts as the support mechanism. The arrangement proposed in the disclosure can be used for packaging any multi-chip semiconductor device.

BRIEF DESCRIPTION OF THE PREFERRED EMBODIMENTS

Figure 5:
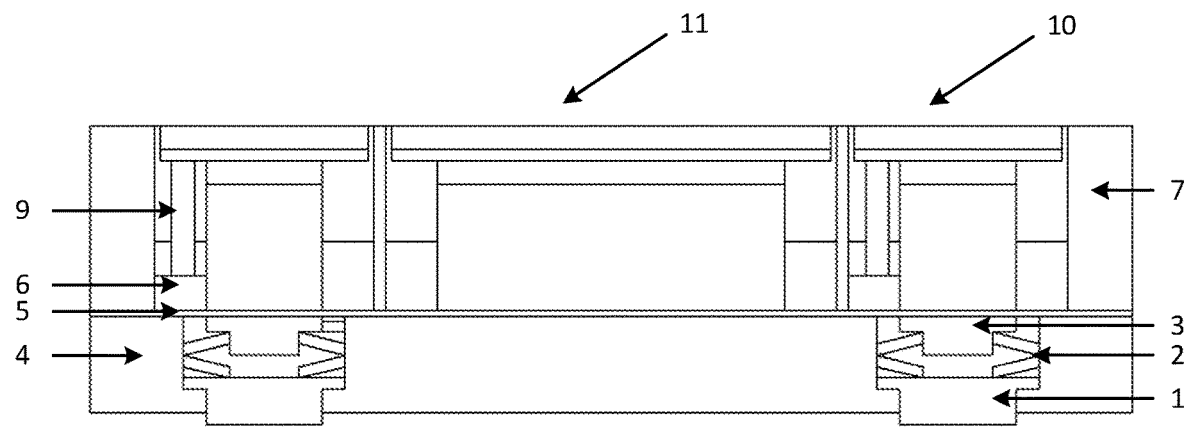
Figure 6:
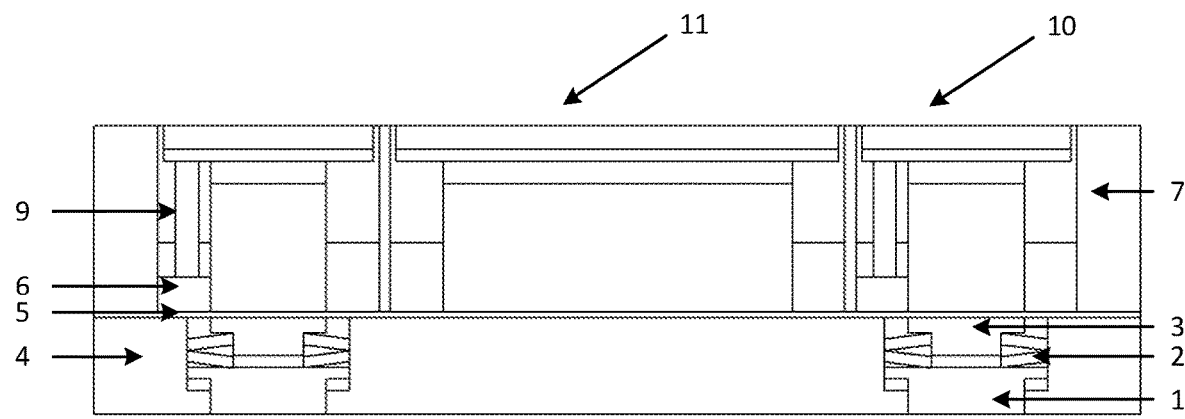
Figure 7:
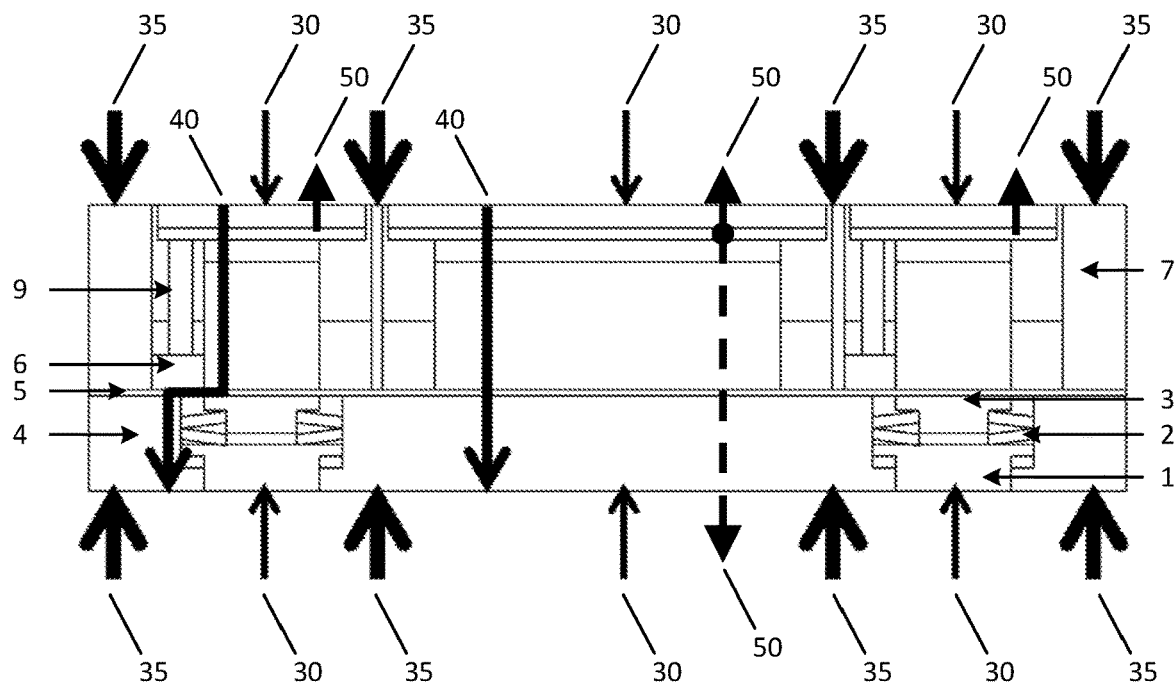
Figure 8:
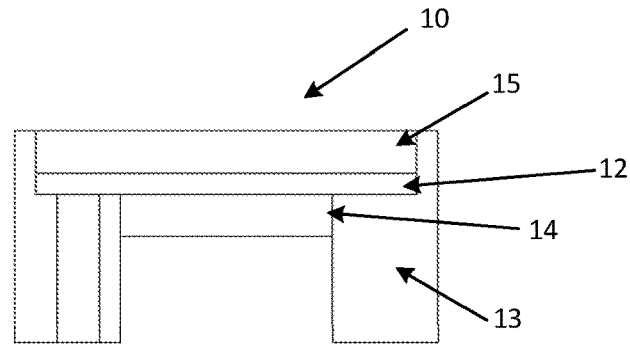
Figure 9:
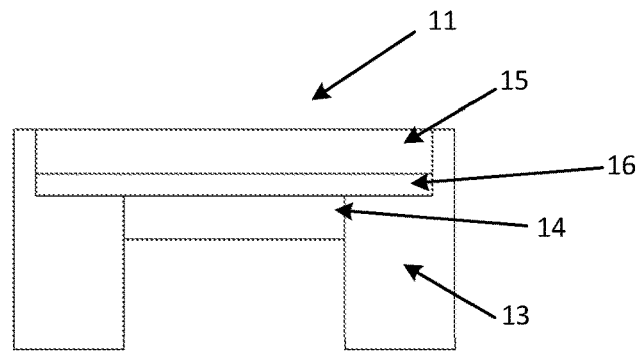
Figure 10:
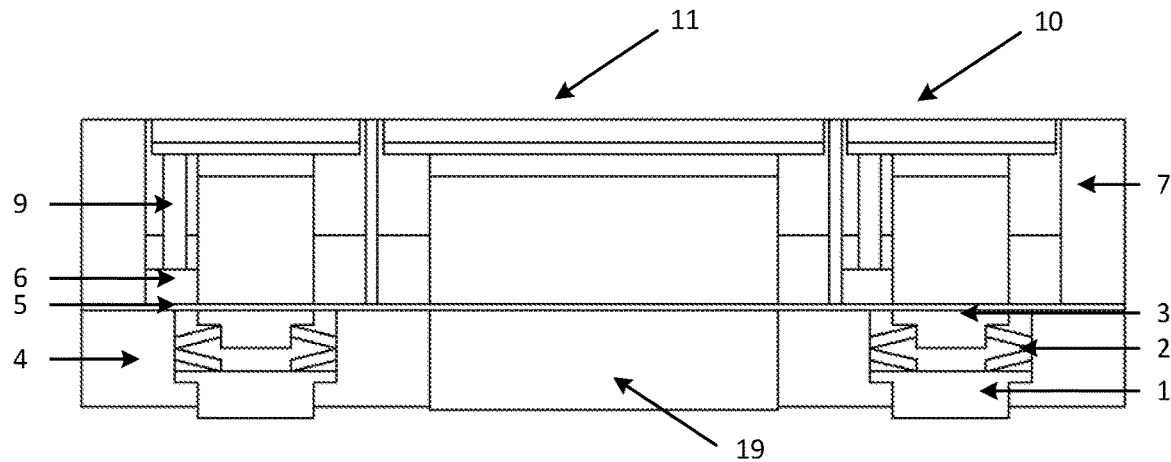
Figure 11:
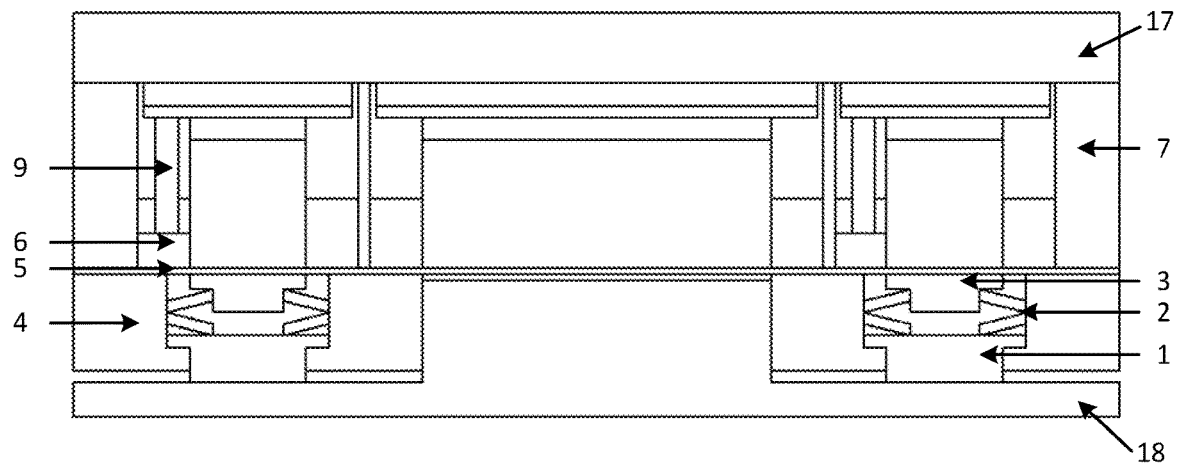
Figure 12:
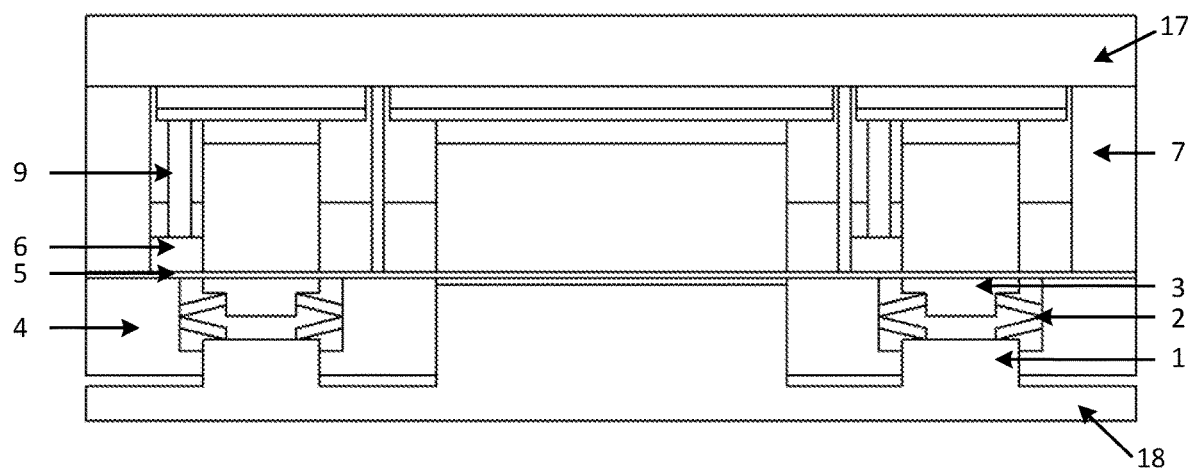
Figure 13:
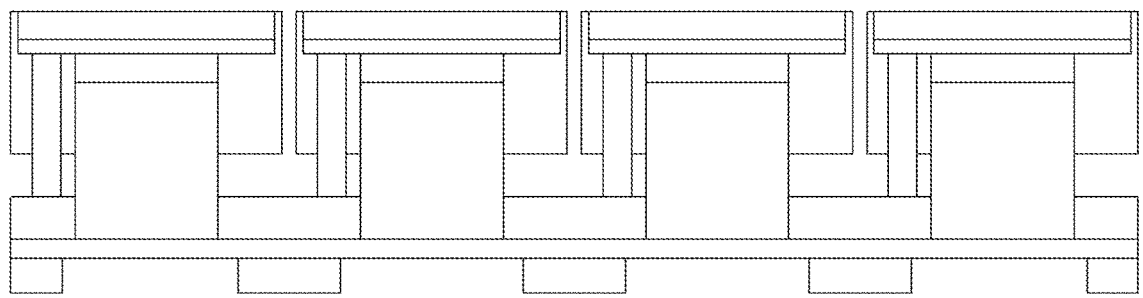
Figure 14:
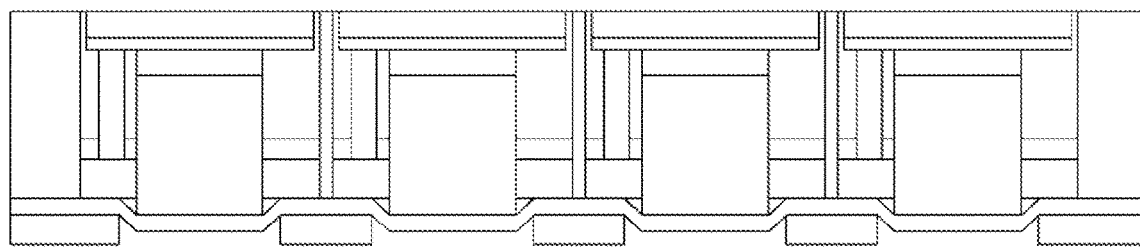
Figure 15:
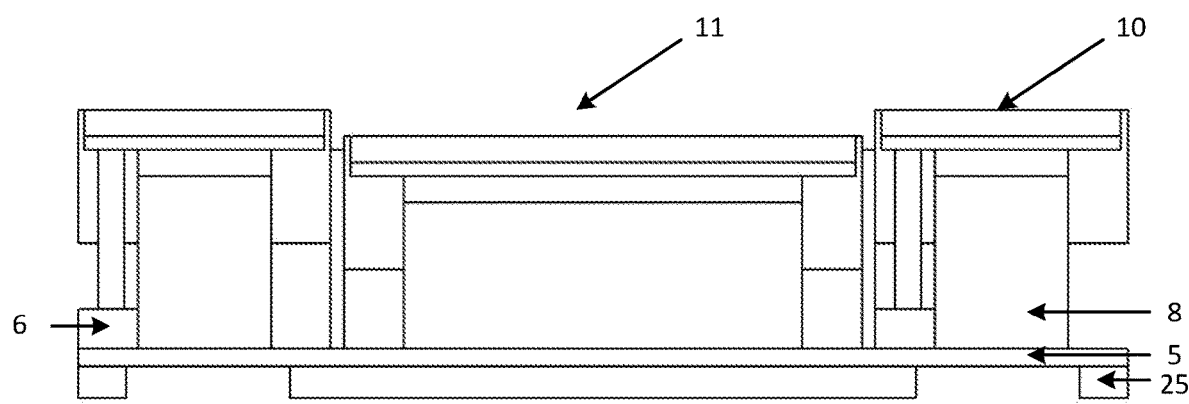
Figure 16:
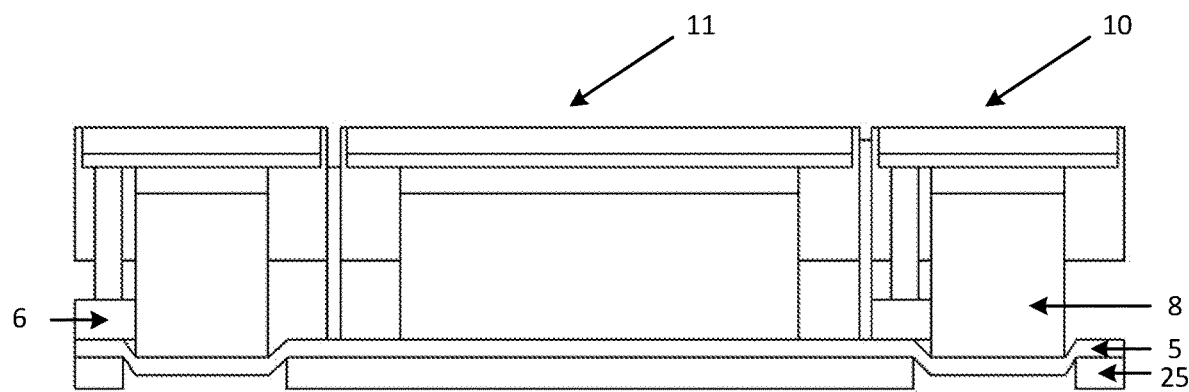
Figure 17:
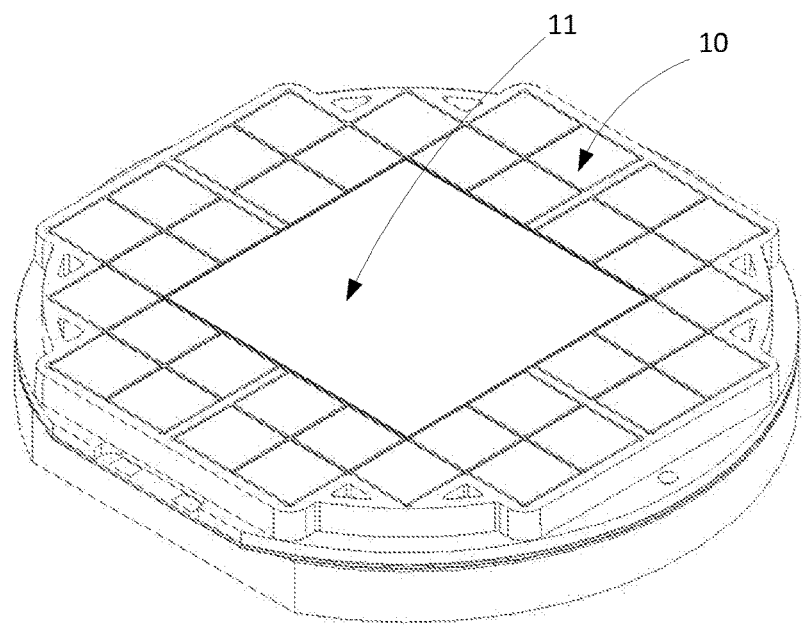

Some preferred embodiments of the disclosure will now be described by way of example only and with reference to the accompanying drawings, in which:

FIG. 1 illustrates a schematic cross-section of a semiconductor sub-assembly according to prior art;
FIG. 2 illustrates a demonstration of the cooling path through the semiconductor sub-assembly of FIG. 1;
FIG. 3 illustrates a schematic cross-section of single-chip pressure contact device according to prior art;
FIG. 4 illustrates a schematic cross-section of an assembled multi-chip pressure contact device according to prior art;
FIG. 5 illustrates a schematic cross-section of a semiconductor sub-assembly according to one embodiment;
FIG. 6 illustrates a schematic cross-section of a semiconductor sub-assembly once the device is mechanically loaded;
FIG. 7 illustrates a demonstration of a conductive path, a mechanical load transmission and a cooling path during operation once the device is mechanically loaded;
FIG. 8 illustrates a schematic cross-section of a semiconductor unit according to the one embodiment;
FIG. 9 illustrates a schematic cross-section of an alternative semiconductor unit according to one embodiment;
FIG. 10 illustrates a schematic cross-section of an alternative semiconductor sub-assembly according to one embodiment;
FIG. 11 illustrates a schematic cross-section of an alternative semiconductor sub-assembly according to one embodiment;
FIG. 12 illustrates a schematic cross section of a semiconductor sub-assembly according to one embodiment having an alternative design for the lower thrust pads and the lower main electrode;
FIG. 13 illustrates a schematic cross-section of an alternative assembled multi-chip pressure contact device according to prior art;
FIG. 14 illustrates a schematic cross-section of an alternative semiconductor sub-assembly according to prior art, once the device is mechanically loaded;
FIG. 15 illustrates a schematic cross-section of an alternative semiconductor sub-assembly according to one embodiment; and
FIG. 16 illustrates a schematic cross-section of an alternative semiconductor sub-assembly once a load is applied; and
FIG. 17 illustrates a perspective view of a semiconductor sub-assembly according to one embodiment.

DETAILED DESCRIPTION OF THE PREFERRED EMBODIMENTS

FIGS. 5 to 12, and 15 to 17 generally describe different embodiments of the present disclosure. In these figures, the following components are used with reference to the following reference numerals.
1—Lower thrust pad—steel (preferably a stainless steel), but could be any suitable hard metal
2—Disc spring stack—a standard grade of high-temperature spring steel
3—Upper thrust pad—same as lower thrust pad
4—Spring locator—copper, but could be any suitably conductive metal, such as aluminium, silver, or an alloy of these
5—Conductive diaphragm or conductive malleable layer—may be copper, but may be any suitable conductive metal, such as spring steel, aluminium or silver, or an alloy of these
6—Control signal distribution printed circuit board—may be a standard high temperature PCB material
7—Basic semiconductor unit locator—polyether ether ketone (PEEK) or other high temperature plastic
8—Pillar or Conductive block—may be copper, but may be any suitably conductive metal, such as aluminium, silver, or an alloy of these
9—Control terminal connection spring pin—may be a gold-plated stainless steel
10—IGBT or any other power device basic unit
11—Diode basic unit
12—IGBT or any other power device chip
13—Electrical breakdown protection 14—Frontside strain buffer—may comprise molybdenum, tungsten or an alloy of molybdenum and copper or tungsten and copper
15—Backside strain buffer—same as front side strain buffer
16—Diode chip
17—Upper main electrode—may be copper
18—Lower main electrode
19—Support block
20—Ceramic housing
21—Chip
25—Standoff plate—may be copper, but may be any suitably conductive metal, such as aluminium, silver, or an alloy of these
30—Force on chips
35—Force on support mechanism
40—Current path
50—Cooling path FIG. 5 illustrates a schematic cross-section of a semiconductor sub-assembly according to one embodiment of the disclosure. The sub-assembly includes a (large area) diode semiconductor unit 11 located laterally in between two IGBT semiconductor units 10. The semiconductor units can be, for example, an insulated gate bipolar transistor (IGBT), a metal oxide semiconductor field effect transistor (MOS-FET), bipolar junction transistor (BJT), or any other type of semiconductor device. The device is configured such that the single diode chip 11 and its associated strain buffers 14, 15, pillar and spring locator replace the function of the support frame in WO/2017/220955, which was used as a support mechanism, limiting displacement of the disc springs and providing a current bypass for the disc springs, in WO/2017/220955.

The lower thrust pads 1, disc spring stacks 2 and upper thrust pads 3 are inserted into holes in the spring locator 4. The disc spring stacks are selected to exert the required pressure on the component stack at a displacement determined by the combined height of the lower thrust pad 1, disc spring stack 2, and upper thrust pad 3, minus the height of the spring locator 4.

Over the top of the spring locator 4 is placed a conductive diaphragm 5. This has a thickness adequate to carry the required current, but is thin enough to flex with the movement of the disc spring stack 2 under load.

Onto the conductive diaphragm 5 is placed a control signal distribution printed circuit board 6. This distributes the control signal applied to the single control terminal of the finished device to the chips within the device.

Over the control signal distribution printed circuit board 6 is placed the basic unit locator 7, which has an array of through holes. Into these holes are placed pillars 8 that will carry the load current and spring pins 9 that will carry the control signal to the chips.

Into each of the through-holes is placed either an IGBT basic unit 10 or a diode basic unit 11.

At this stage, the basic unit locator 7 is typically fixed to the spring locator 4 using non-conductive screws or another appropriate method, securing all loose components inside the sub-assembly.

The device of the present disclosure may subsequently be assembled into a traditional ceramic capsule or other appropriate power semiconductor housing between two main electrodes: an upper main electrode 17 and a lower main electrode 18.

The front-side 14 and backside 15 strain buffers may or may not be attached to the IGBT 12 and diode 16 chips by soldering, alloying, or silver sintering.

The pillar 8 and the front-side strain buffer 14 may be formed of one piece of material. This may or may not be attached to the front-side of the IGBT 12 and diode 16 chips by soldering or silver sintering.

The IGBT 12 and diode 16 chips can be replaced with other power semiconductor chips (e.g. thyristors or MOSFETs).

The control terminal connection spring pin 6 may also be made an integral part of the IGBT basic unit 10, rather than being located in the basic unit locator 7.

FIG. 6 illustrates a schematic cross-section of a semiconductor sub-assembly as shown in FIG. 5, once the device is mechanically loaded.

In operation, a prescribed total device load is applied to the upper electrode 17 and lower electrodes 18 as shown in FIGS. 6 and 7. This prescribed load is greater, by a predetermined margin, than that which depresses the disc springs in each component stack to such a degree that the lowermost surface of the lower thrust pad 1 is brought into line with the lowermost surface of the spring locator 4. The load required to achieve this is defined as the threshold load. All load in excess of the threshold load is supported by the component stack consisting of the diode basic unit 11, pillar 8, conductive diaphragm 5 and spring locator 4. The power device (e.g. IGBT) chips are, therefore, protected from over-pressurisation by the support mechanism. The margin between the threshold load and total device load is set at such a value so as to ensure optimum performance of the diode chip. At the prescribed total device load, the IGBT chips and diode chip are optimally loaded.

FIG. 7 illustrates a demonstration of conductive path, mechanical load transmission and cooling path during operation once the device is mechanically loaded. A force is applied to the support mechanism 35, and load 30 is applied through the spring 2.

Once pressurised to the prescribed load:
A primary electrical conductive path 40 is established through the spring locator 4, conductive foil 5, pillar 8, to the IGBT basic unit 10 and diode basic unit 11.
A secondary electrical conductive path also exists from the lower thrust pad 1, through the disc spring stack 2, upper thrust pad 3, conductive diaphragm 5, and pillar 8 to the IGBT 10 and diode 11 basic units.
A cooling path 50 for the IGBT chip 12 is provided on the unsprung side of the device, through each chips backside strain buffer 15. There is negligible cooling on the sprung side of the device for the IGBT chips 12.
A cooling path 50 is provided on both sides of the diode chip 16. The first is provided on the unsprung side of the device, through the diode chip's backside strain buffer 15 with a second cooling path provided on the sprung side of the device through the diode chip's frontside strain buffer 14, pillar 8, conductive diaphragm 5 and spring locator 4.

FIG. 8 illustrates a schematic cross-section of an IGBT basic semiconductor unit according to one embodiment. Into each of the through-holes is placed either an IGBT basic unit 10 or a diode basic unit 11. An IGBT basic unit consists of an IGBT chip 12 with protection from electrical breakdown at the edge of the chip 13, frontside 14, and backside 15 strain buffers.

FIG. 9 illustrates a schematic cross-section of a diode basic semiconductor unit according to one embodiment. A diode basic unit consists of a diode chip 16 with protection from electrical breakdown at the edge of the chip 13, frontside 14, and backside 15 strain buffers, as shown in FIG. 9.

FIG. 10 illustrates a schematic cross-section of an alternative semiconductor sub-assembly according to one embodiment. Many of the features of FIG. 10 are the same as those shown in FIG. 5 and therefore carry the same reference numerals. In this embodiment, the solid portion of the spring locator 4 in line with the diode may be made from a separate block of material 19.

FIG. 11 illustrates a schematic cross-section of an alternative semiconductor sub-assembly according to one embodiment. Many of the features of FIG. 11 are the same as those shown in FIG. 5 and therefore carry the same reference numerals. The sub-assembly will typically be housed within a traditional ceramic capsule, as is used to house thyristors. In this embodiment this solid block 19 forms an integral part of the lower main electrode 18.

FIG. 12 illustrates a schematic cross section of an alternative semiconductor sub-assembly according to one embodiment. This embodiment demonstrates an alternative configuration of the lower thrust pads and lower main electrode. In this embodiment the lower thrust pads 1 are formed as an integral part of the lower main electrode 18.

FIG. 15 illustrates a schematic cross-section of an alternative semiconductor sub-assembly according to one embodiment. Many of the features of FIG. 15 are the same as those shown in FIG. 5 and therefore carry the same reference numerals. In this embodiment the disc springs are omitted and instead the diaphragm is designed to act as the spring mechanism. The sub-assembly includes the semiconductor units 10, 11 laterally spaced from one another. Each semiconductor unit 10, 11 is coupled (or operatively connected) with a conductive block or pillar 8. There is provided a conductive diaphragm 5 which is coupled with each conductive block 8. The conductive block 8 touches a first surface of the conductive diaphragm 5. The subassembly also includes a stand-off plate 25 operatively coupled or connected to a second surface of the conductive diaphragm 5. The second surface of the diaphragm 5 is an opposing surface of the first surface of the conductive diaphragm 5. In other words, the conductive diaphragm 5 is located in between the stand-off plate 25 and conductive block 8. Similarly, the conductive block 8 is located between the semiconductor units 10, 11 and the conductive diaphragm 5. The stand-off plate 25 includes a plurality of holes, each of which is substantially aligned with each conductive block 8. Similarly to the previous embodiments, this embodiment includes a larger diode semiconductor unit located laterally in between two IGBT semiconductor units. The stand-off plate 25 is solid in the region aligned with the conductive block 8 of the large area diode semiconductor unit 11.

FIG. 16 illustrates a schematic cross-section of a semiconductor sub-assembly as shown in FIG. 15, once the device is mechanically loaded. When a mechanical load is applied to the sub-assembly, each conductive block 8 forces the conductive diaphragm 5 to flex into each hole of the stand-off plate 25. As the stand-off plate 25 is solid in the region aligned with the conductive block 8 of the large area diode semiconductor unit 11, the conductive diaphragm 5 is prevented from flexing in the region underneath the diode semiconductor unit 11. The sub-assembly also includes a printed circuit board 6 coupled with the conductive diaphragm 5 and the semiconductor units 10, 11. The printed circuit board 6 includes a plurality of holes each are aligned with each hole of the stand-off plate 25.

FIG. 17 shows a semiconductor sub-assembly according to one embodiment. The sub-assembly includes a (large area) diode semiconductor unit 11 located laterally in between IGBT semiconductor units 10.

Although the above mentioned description is directed to a power semiconductor device chip but it would be appreciated that other semiconductor devices could also be possible to use in this disclosure.

The skilled person will understand that in the preceding description and appended claims, positional terms such as 'above', 'overlap', 'under', 'lateral', etc. are made with reference to conceptual illustrations of an device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A semiconductor device sub-assembly comprising:
a plurality of semiconductor units of a first type;
a plurality of semiconductor units of a second type;
a plurality of conductive blocks operatively coupled with the plurality of semiconductor units;
a conductive malleable layer operatively coupled with the plurality of conductive blocks, wherein the plurality of conductive blocks are located between the conductive malleable layer and the plurality of semiconductor units; and
wherein, in use, at least some of the plurality of conductive blocks are configured to apply a pressure on the conductive malleable layer, when a predetermined pressure is applied to the semiconductor device sub-assembly; and
wherein at least one semiconductor unit of a second type is configured to withstand an applied pressure greater than a threshold pressure.

2. A semiconductor device sub-assembly according to claim 1, wherein the plurality of semiconductor units of a second type are located laterally in between the plurality of semiconductor units of a first type.

3. A semiconductor device sub-assembly according to claim 1, wherein at least one semiconductor unit of a second type is configured to limit displacement of the plurality of semiconductor units of a first type.

4. A semiconductor device sub-assembly according to claim 1, wherein at least one semiconductor unit of a second type has a substantially larger area compared to each semiconductor unit of a first type.

5. A semiconductor device sub-assembly according to claim 1, wherein the sub-assembly is configured such that, after the pressure is applied, a thermal conductive path is established in opposing directions through at least one semiconductor unit of a second type.

6. A semiconductor device sub-assembly according to claim 1, wherein at least one semiconductor unit of a first type is an insulated gate bipolar transistor (IGBT) unit; or wherein at least one semiconductor unit of a second type is a diode unit.

7. A semiconductor device sub-assembly according to claim 1, further comprising:
a first electrode directly operatively connected to the plurality of semiconductor units; and
a second electrode operatively connected to the conductive malleable layer, and
optionally wherein the first electrode is located on a top surface of the sub-assembly and the second electrode is located on a bottom surface of the sub-assembly.

8. A semiconductor device sub-assembly to claim 1, wherein at least some of the conductive blocks are configured to flex the conductive malleable layer.

9. A semiconductor device sub-assembly according to claim 1, wherein the conductive malleable layer and conductive blocks are formed using one piece of material.

10. A semiconductor device sub-assembly according to claim 8, further comprising a stand-off plate operatively connected with an opposing surface of the conductive malleable layer compared to a surface of the conductive malleable layer to which the conductive block is coupled; and
optionally wherein the stand-off plate and conductive malleable layer are formed using one piece of material; and
optionally wherein the stand-off plate, conductive malleable layer and conductive blocks are formed using one piece of material.

11. A semiconductor device sub-assembly according to claim 1, further comprising a semiconductor unit locator comprising a plurality of holes wherein at least some of the plurality of semiconductor units are located in at least some of the holes of the semiconductor unit locator.

12. A semiconductor device sub-assembly according to claim 1, further comprising a plurality of pressure means for applying pressure to the plurality of the semiconductor units, wherein the conductive malleable layer is located between the plurality of pressure means and the semiconductor unit locator; and
optionally wherein the pressure means comprises a spring; and/or
wherein at least one of the plurality of semiconductor units of a first type is located vertically above a pressure means; and/or
wherein at least one of the plurality of semiconductor units of a second type is not located above a pressure means; and/or
wherein each of the plurality of pressure means are located underneath a semiconductor unit of a first type.

13. A semiconductor device sub-assembly according claim 12, further comprising a spring locator comprising a plurality of holes, wherein each pressure means is located in each hole of the spring locator; and
optionally wherein the spring locator is solid in the region under the semiconductor units of a second type.

14. A semiconductor device sub-assembly according to claim 13, wherein the spring locator comprises:
a first portion wherein the first portion is operatively connected to the plurality of semiconductor units of a first type; and
a second portion wherein the second portion is operatively connected to the plurality of semiconductor units of a second type; and
optionally wherein the first portion and the second portion are separate blocks; and
optionally wherein the first portion and the second portion comprise different materials; and/or
wherein the second portion forms part of a second electrode operatively connected to the conductive malleable layer.

15. A semiconductor device sub-assembly according to claim 14, wherein the spring locator is operatively connected with the conductive malleable layer.

16. A semiconductor device sub-assembly according to claim 14, further comprising a first thrust pad and a second thrust pad within the holes of the spring locator on both sides of the pressure means, wherein the first thrust pad is protruded from a first surface of the spring locator and the second thrust pad is in contact with the conductive malleable layer; and
optionally wherein the first and second thrust pad and the pressure means are integrated into a discrete component; and/or
wherein the pressure means is selected such that a predetermined pressure is exerted using the spring locator, the pressure means, the first thrust pad, and the second thrust pad; and/or
wherein the second thrust pad forms part of a second electrode operatively connected to the conductive malleable layer.

17. A semiconductor device sub-assembly according to claim 16, wherein the predetermined pressure is applied to a threshold pressure limit so that the applied pressure compresses each pressure means to a degree that a lower most surface of the first thrust pad is in line with a lower most surface of the spring locator; and
optionally wherein the applied pressure above the threshold pressure limit is supported by the spring locator, conductive malleable layer, and the plurality of semiconductor units of a second type.

18. A semiconductor device sub-assembly according to claim 1, wherein each of the plurality of semiconductor units of a first type comprises:
an IGBT chip;
a protection layer at the edge of the semiconductor chip;
a front side strain buffer;
a back side strain buffer;
a control terminal connection spring pin.

19. A semiconductor device sub-assembly according to claim 1, wherein at least some of the plurality of semiconductor units of a second type comprises:
a diode chip;
a protection layer at the edge of the semiconductor chip;
a front side strain buffer;
a back side strain buffer.

20. A method for manufacturing a semiconductor device sub-assembly, the method comprising:
providing a plurality of semiconductor units of a first type;
providing a plurality of semiconductor units of a second type;
providing a plurality of conductive blocks operatively coupled with the plurality of semiconductor units;
providing a conductive malleable layer operatively coupled with the plurality of conductive blocks, wherein the plurality of conductive blocks are located between the conductive malleable layer and the plurality of semiconductor units, wherein at least some of the plurality of conductive blocks are used to apply a pressure on the conductive malleable layer, when a predetermined pressure is applied to the semiconductor device sub-assembly; and wherein at least one semiconductor unit of a second type withstands an applied pressure greater than a threshold pressure.

\* \* \* \* \*